United States Patent
Wang et al.

(10) Patent No.: US 10,424,526 B2
(45) Date of Patent: Sep. 24, 2019

(54) CHIP PACKAGE STRUCTURE AND MANUFACTURING METHOD THEREOF

(71) Applicant: Powertech Technology Inc., Hsinchu County (TW)

(72) Inventors: Chi-An Wang, Hsinchu County (TW); Hung-Hsin Hsu, Hsinchu County (TW); Wen-Hsiung Chang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/782,857

(22) Filed: Oct. 13, 2017

(65) Prior Publication Data
US 2018/0114734 A1 Apr. 26, 2018

Related U.S. Application Data

(60) Provisional application No. 62/410,853, filed on Oct. 21, 2016.

(51) Int. Cl.
*H01L 23/31* (2006.01)
*H01L 21/52* (2006.01)
(Continued)

(52) U.S. Cl.
CPC ...... *H01L 23/3128* (2013.01); *H01L 21/2885* (2013.01); *H01L 21/4803* (2013.01); *H01L 21/4817* (2013.01); *H01L 21/4846* (2013.01); *H01L 21/4853* (2013.01); *H01L 21/52* (2013.01); *H01L 21/56* (2013.01); *H01L 21/565* (2013.01); *H01L 23/055* (2013.01); (Continued)

(58) Field of Classification Search
CPC ............... H01L 21/52; H01L 21/568; H01L 2021/60022; H01L 2021/6006; H01L 23/041; H01L 23/055; H01L 23/06; H01L 23/293; H01L 23/3114; H01L 23/3128; H01L 23/3142; H01L 2924/17151; H01L 2924/177; H01L 2924/181
See application file for complete search history.

(56) References Cited

U.S. PATENT DOCUMENTS 7,291,906 B2   11/2007   Cha et al.
8,119,929 B2   2/2012    Horiuchi et al.
(Continued)

OTHER PUBLICATIONS

"Office Action of Taiwan Counterpart Application", dated Mar. 19, 2018, p. 1-p. 5.

*Primary Examiner* — Stephen W Smoot
(74) *Attorney, Agent, or Firm* — JCIPRNET

(57) ABSTRACT

A chip package structure includes a redistribution layer, at least one chip, a reinforcing frame, an encapsulant and a plurality of solder balls. The redistribution layer includes a first surface and a second surface opposite to each other. The chip is disposed on the first surface and electrically connected to the redistribution layer. The reinforcing frame is disposed on the first surface and includes at least one through cavity. The chip is disposed in the through cavity and a stiffness of the reinforcing frame is greater than a stiffness of the redistribution layer. The encapsulant encapsulates the chip, the reinforcing frame and covering the first surface. The solder balls are disposed on the second surface and electrically connected to the redistribution layer.

16 Claims, 4 Drawing Sheets

(51) Int. Cl.

| | |
|---|---|
| *H01L 23/055* | (2006.01) |
| *H01L 21/288* | (2006.01) |
| *H01L 21/48* | (2006.01) |
| *H01L 21/56* | (2006.01) |
| *H01L 23/498* | (2006.01) |
| *H01L 23/12* | (2006.01) |
| *H01L 23/488* | (2006.01) |
| *H01L 23/00* | (2006.01) |
| *H01L 23/16* | (2006.01) |
| *H01L 21/60* | (2006.01) |

(52) U.S. Cl.
CPC .............. *H01L 23/12* (2013.01); *H01L 23/16* (2013.01); *H01L 23/3114* (2013.01); *H01L 23/3142* (2013.01); *H01L 23/488* (2013.01); *H01L 23/49816* (2013.01); *H01L 23/49827* (2013.01); *H01L 23/49838* (2013.01); *H01L 23/562* (2013.01); *H01L 24/19* (2013.01); *H01L 24/20* (2013.01); *H01L 24/26* (2013.01); *H01L 21/568* (2013.01); *H01L 24/13* (2013.01); *H01L 24/16* (2013.01); *H01L 24/32* (2013.01); *H01L 24/48* (2013.01); *H01L 24/73* (2013.01); *H01L 24/81* (2013.01); *H01L 24/83* (2013.01); *H01L 24/85* (2013.01); *H01L 24/92* (2013.01); *H01L 2021/6006* (2013.01); *H01L 2021/60022* (2013.01); *H01L 2224/04105* (2013.01); *H01L 2224/12105* (2013.01); *H01L 2224/131* (2013.01); *H01L 2224/16227* (2013.01); *H01L 2224/32225* (2013.01); *H01L 2224/48091* (2013.01); *H01L 2224/48106* (2013.01); *H01L 2224/48227* (2013.01); *H01L 2224/73265* (2013.01); *H01L 2924/17151* (2013.01); *H01L 2924/181* (2013.01); *H01L 2924/182* (2013.01); *H01L 2924/3511* (2013.01)

(56) References Cited

U.S. PATENT DOCUMENTS

| | | | |
|---|---|---|---|
| 8,772,913 B1* | 7/2014 | Muniandy | H01L 23/367 257/675 |
| 2002/0135063 A1 | 9/2002 | Alcoe et al. | |
| 2007/0152326 A1* | 7/2007 | Lim | H01L 21/56 257/723 |
| 2008/0099910 A1 | 5/2008 | McLellan et al. | |
| 2011/0215463 A1 | 9/2011 | Lin et al. | |
| 2014/0061944 A1 | 3/2014 | Lin et al. | |
| 2016/0181218 A1 | 6/2016 | Karhade et al. | |

* cited by examiner

CHIP PACKAGE STRUCTURE AND MANUFACTURING METHOD THEREOF

CROSS REFERENCE TO RELATED APPLICATION

This application claims the priority benefit of U.S. provisional application Ser. No. 62/410,853, filed on Oct. 21, 2016. The entirety of the above-mentioned patent application is hereby incorporated by reference herein and made a part of specification.

BACKGROUND OF THE INVENTION

Field of the Invention

The present invention generally relates to a package structure and manufacturing method thereof. More particularly, the present invention relates to chip package structure and manufacturing method.

Description of Related Art

Modern electronic devices require small size, large memory capacity and high performance for their applications such as mobile applications. Consequently, semiconductor chip packages that go into modern electronic devices, such as mobile electronic devices, also have to have small size, large memory capacity, and high performance.

Typically, a printed circuit board (PCB) includes an insulating substrate, which is typically made of a polyimide material, and a conductive pattern, which is typically made of copper (Cu). The conductive pattern may be disposed in between layers of the substrate or it may be disposed on one of the substrate surfaces. When a chip package is used in an electronic system, such as the main board in a mobile electronic device, the package may be subjected to a high thermal process for bonding purposes. The high thermal process used to either form solder balls or join the chip package to the circuit board may cause warpage of the chip package due to the coefficient of thermal expansion (CTE) mismatch between the various components in the chip package. This warpage may lead to open connection failures between the chip package and the circuit board. Such warpage also causes non-uniform height of the solder balls against the main board during mounting, thereby causing contact failures.

SUMMARY OF THE INVENTION

Accordingly, the present invention is directed to a chip package structure and a manufacturing method thereof, wherein warpage of the chip package structure is reduced and the reliability and the structural strength of the chip package structure is enhanced.

The present invention provides a chip package structure includes a redistribution layer, at least one chip, a reinforcing frame and an encapsulant. The redistribution layer includes a first surface and a second surface opposite to each other. The chip is disposed on the first surface and electrically connected to the redistribution layer. The reinforcing frame is disposed on the first surface and includes at least one through cavity. The chip is disposed in the through cavity and a stiffness of the reinforcing frame is greater than a stiffness of the redistribution layer. The encapsulant encapsulates the chip, the reinforcing frame and covering the first surface.

The present invention provides a manufacturing method of a chip package structure. The method includes the following steps. At least one chip is disposed on a carrier. A reinforcing frame is disposed on the carrier, wherein the reinforcing frame includes at least one through cavity, and the chip is disposed in the through cavity. An encapsulant is formed to encapsulate the chip, the reinforcing frame and covering the carrier. The carrier is removed to expose bottom surfaces of the encapsulant, the chip and the reinforcing frame. A redistribution layer is formed on the bottom surfaces of the encapsulant, the chip and the reinforcing frame, wherein a stiffness of the reinforcing frame is greater than a stiffness of the redistribution layer.

In light of the foregoing, the chip package structure of the disclosure is subjected to high thermal process, e.g. forming solder balls on the redistribution layer, which may cause warpage of the chip package structure. Accordingly, the reinforcing frame is configured to surround the chip before the redistribution layer and the solder balls are formed. The stiffness of the reinforcing frame is greater than the stiffness of the redistribution layer, so as to enhance the stiffness and structural strength of the chip package structure. Moreover, the warpage of the chip package structure may be reduced, and the reliability of the chip package structure is improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
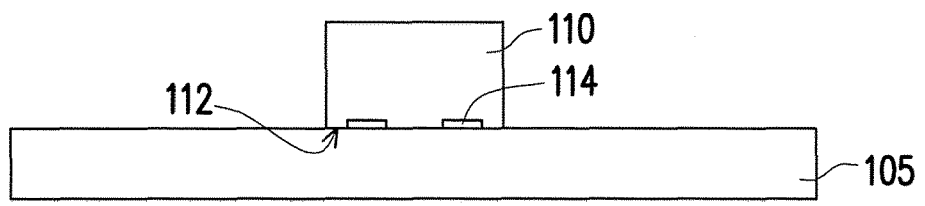
FIG. 1 to FIG. 7 illustrate a manufacturing method of a chip package structure according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 to FIG. 7 illustrate a manufacturing method of a chip package structure according to an embodiment of the invention. In the present embodiment, a manufacturing method of a chip package structure includes the following steps. Referring to FIG. 1, at least one chip 110 (one chip is illustrated herein) is disposed on a carrier 105. The chip 110 includes an active surface 112 facing the carrier 105 and a plurality of pads 114 disposed on the active surface 112. In the present embodiment, the chip is mounted on the carrier 105 by a flip-chip bonding technique, but the disclosure is not limited thereto.

Figure 2:
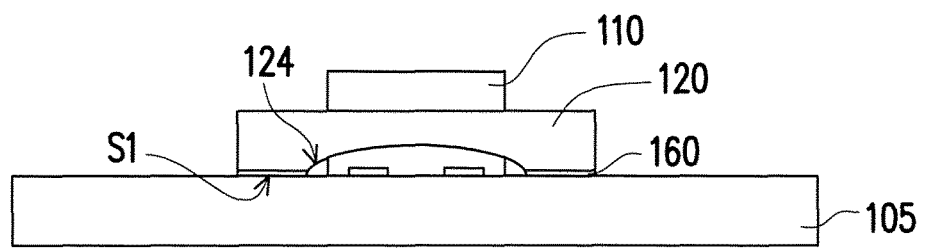
Figure 3:
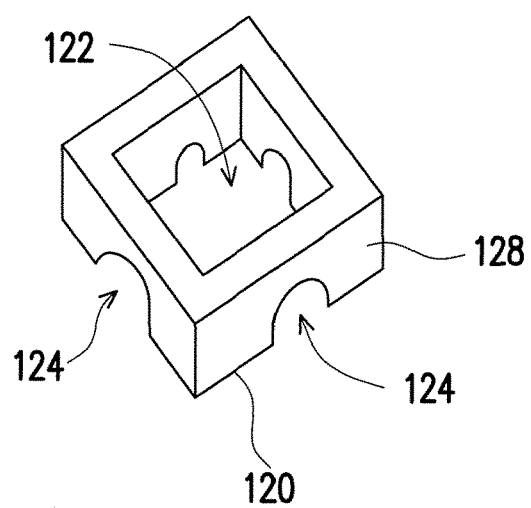

Next, referring to FIG. 2 and FIG. 3, a reinforcing frame 120 as shown in FIG. 3 is disposed on the carrier 105. Herein, the reinforcing frame 120 includes at least one through cavity 122. The chip 110 is disposed in the through cavity 122 as shown in FIG. 2. In the present embodiment, the reinforcing frame 120 may further include a bottom surface S1 and at least one channel 124. The bottom surface S1 is in contact with the carrier 105. The channel 124 is disposed on the side wall 128 of the reinforcing frame 120. The channel 124 communicates with the through cavity 122 as shown in FIG. 3. In the present embodiment, the material of the reinforcing frame 120 may include metal, but the disclosure is not limited thereto.

In addition, an adhesion layer 160 may be disposed on the carrier 105 before the reinforcing frame 120 is disposed on the adhesion layer 160. Namely, the adhesion layer 160 is disposed between the carrier 105 and the reinforcing frame 120 so the reinforcing frame 120 is attached to the carrier 105 by the adhesion layer 160. The adhesion layer 160 may include a solder paste or a die attach film (DAF).

Figure 4:
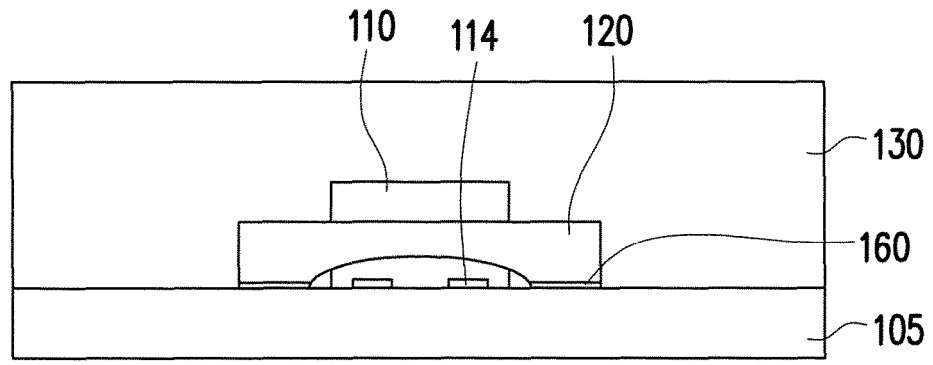

Then, referring to FIG. 4, an encapsulant 130 is formed to encapsulate the chip 110, the reinforcing frame 120 and cover the carrier 105. In the present embodiment, the encapsulant 130 fills the through cavity 122 to encapsulate the chip 110 and may flow out of the through cavity 122 through the channel 124 to evenly cover the top surface of the carrier 105. Accordingly, the encapsulant 130 fills both of the through cavity 122 and the channel 124.

Figure 5:
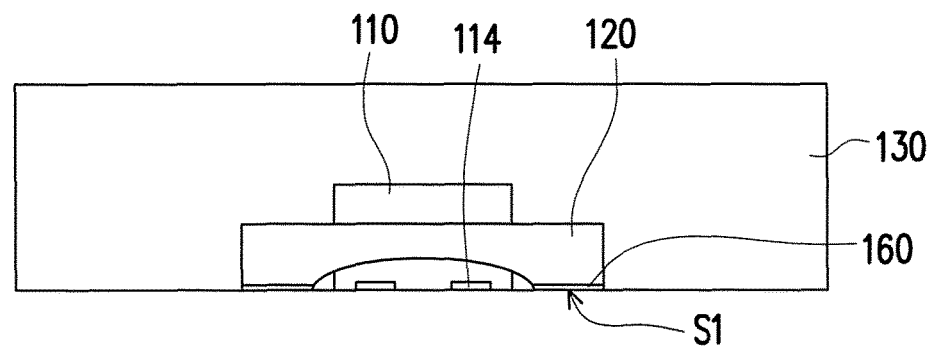
Figure 6:
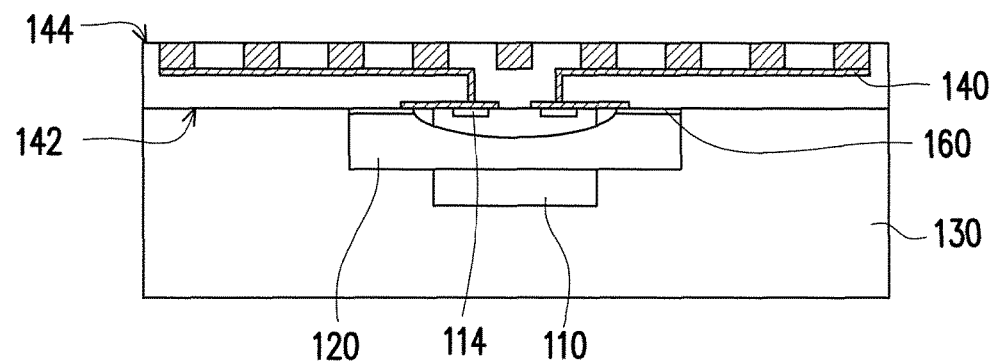

Next, referring to FIG. 5 and FIG. 6, the carrier 105 is removed to expose a bottom surface S1 including exposed surfaces of the encapsulant 130, the chip 110 and the reinforcing frame 120. In some other embodiment the adhesion layer 160 may be formed to cover the whole top surface of the carrier 105 to fix the reinforcing frame 120 and the chip 110 in place. In this way, when the carrier is removed, the bottom surface S1 may be a planar surface. Then, the structure shown in FIG. 5 may be flipped over to form a redistribution layer 140 on the bottom surface S1. In the present embodiment, a stiffness of the reinforcing frame 120 is greater than a stiffness of the redistribution layer 140. Namely, the reinforcing frame 120 is stiffer than the redistribution layer 140 to provide structural strength to the chip package structure 100.

Figure 7:
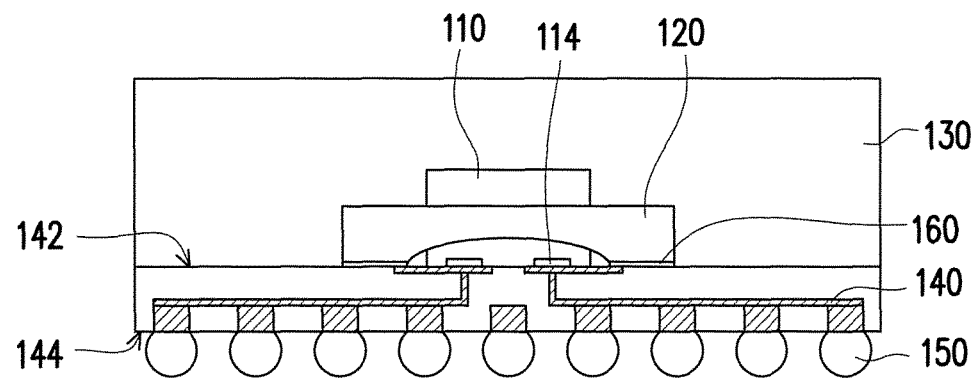

Then, referring to FIG. 7, a plurality of solder balls 150 are formed on the redistribution layer 140. The solder balls 150 are electrically connected to the redistribution layer 140. At the time, the manufacturing process of the chip package structure 100 may be substantially done.

In the present embodiment, the chip package structure 100 is subjected to the high thermal process of forming solder balls 150 on the redistribution layer 140 and/or joining the chip package structure 100 to a circuit board. The high thermal process may cause warpage of the chip package structure due to the coefficient of thermal expansion (CTE) mismatch between the various components in the chip package structure 100. Accordingly, the reinforcing frame 120 is configured to surround the chip 110 before the solder balls 150 is formed to enhance the stiffness of the chip package structure 100 and reduce the warpage due to the high thermal process.

In a structural point of view, referring to FIG. 7, the chip package structure 100 manufactured by the method disclosed above may include the redistribution layer 140, the chip 110, the reinforcing frame 120, the encapsulant 130 and a plurality of solder balls 150. The redistribution layer 140 includes a first surface 142 and a second surface 144 opposite to each other. The chip 110 is disposed on the first surface 142 and electrically connected to the redistribution layer 140. The reinforcing frame 120 is disposed on the first surface 142 and includes the through cavity 122. The chip is disposed in the through cavity 122 and the stiffness of the reinforcing frame 120 is greater than the stiffness of the redistribution layer 140. The encapsulant 130 encapsulates the chip 110, the reinforcing frame 120 and covering the first surface 142. The solder balls 150 are disposed on the second surface 144 and electrically connected to the redistribution layer 140.

In the present embodiment, the reinforcing frame 120 may further include the channel 124. The channel 124 is formed on the side wall of the reinforcing frame 120. The channel 124 communicates with the through cavity 122. The bottom surface S1 is the surface facing the redistribution layer 140. The bottom surface of the reinforcing frame 120 may further include the adhesion layer 160, so that the reinforcing frame 120 may be adhered to the carrier 105 by the adhesion layer 160. The adhesion layer 160 may include a solder paste or a die attach film. In some other embodiment, the bottom surface of the reinforcing frame 120, the active surface of the chip 110, and the encapsulant 130 may be coplanar to each other. Thus, the redistribution layer 140 may be directly formed on the bottom surface of the reinforcing frame 120, the active surface of the chip 110, and the encapsulant 130.

Figure 8:
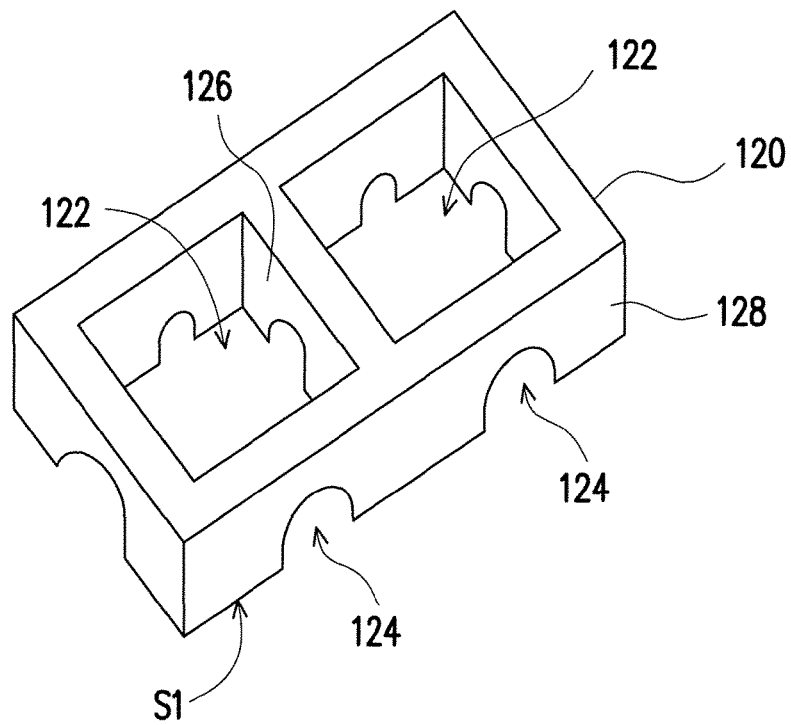
FIG. 8 illustrates a reinforcing frame according to au embodiment of the invention.
Figure 9:
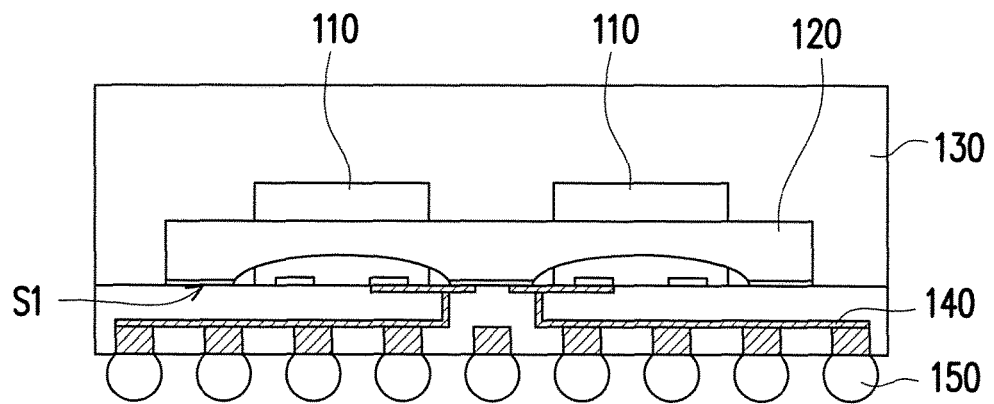
FIG. 9 illustrates a chip package structure according to an embodiment of the invention.

FIG. 8 illustrates a reinforcing frame according to an embodiment of the invention. FIG. 9 illustrates a chip package structure according to an embodiment of the invention. It is noted that the chip package structure 100a shown in FIG. 9 contains many features same as or similar to the chip package structure 100 disclosed earlier with FIG. 7. For purpose of clarity and simplicity, detail description of same or similar features may be omitted, and the same or similar reference numbers denote the same or like components. The main differences between the chip package structure 100a shown in FIG. 9 and the chip package structure 100 shown in FIG. 7 are described as follows.

In the present embodiment, the chip package structure 100a may include a plurality of chips 110, and the reinforcing frame 120 may correspondingly include a plurality of through cavities 122. The chips 110 are disposed in the through cavities 122 respectively. In addition, the reinforcing frame 120 may further include a plurality of channels 124 and at least one division wall 126. The division wall 126 is disposed between any two adjacent through cavities 122 to define the through cavities 122. The channels 124 are disposed on the side walls 128 and/or the division wall 126 of the reinforcing frame 120. The channels 124 communicate with the through cavities 122. In the present embodiment, at least one of the channels 124 are disposed on the division wall 126, such that the through cavities 122 is capable of communicate with each other through the channels 124 on the division wall 126. Accordingly, when the encapsulant 130 is formed to encapsulate the chips 110, the encapsulant 130 may flow through the through cavities 122 via the channel 124 on the division wall 126 to encapsulate each of the chips 110. Also, the encapsulant 130 may flow out of the through cavities 122 via the channel 124 to evenly cover the top surface of the carrier 105. Moreover, since the encapsulant 130 wraps around the reinforcing frame 120 through the channel 124, the reinforcing frame 120 is locked firmly and securely in the encapsulant 130, so as to improve the reliability of the chip package structures 100, 100a.

In sum, the chip package structure of the disclosure is subjected to high thermal process such as forming solder balls on the redistribution layer. The high thermal process may cause warpage of the chip package structure. Accordingly, the reinforcing frame is configured to surround the chip before the solder balls is formed. The stiffness of the reinforcing frame is greater than the stiffness of the redistribution layer, so as to enhance the stiffness and structural strength of the chip package structure. As such, the warpage of the chip package structure may be reduced, and the reliability of the chip package structure is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
a redistribution layer, comprising a first surface and a second surface opposite to each other;
at least one chip, disposed on the first surface and electrically connected to the redistribution layer;
a reinforcing frame disposed on the first surface and comprising at least one through cavity, wherein the chip is disposed in the through cavity and a stiffness of the reinforcing frame is greater than a stiffness of the redistribution layer; and
an encapsulant encapsulating the chip, the reinforcing frame and covering the first surface,
wherein the number of the at least one chip is plural, the number of the at least one through cavity is plural, the chips are disposed in the through cavities respectively, the reinforcing frame further comprises a plurality of channels disposed on a plurality of side walls of the reinforcing frame, and the channels communicate with the through cavities.

2. The chip package structure as claimed in claim 1, further comprising a plurality of solder balls disposed on the second surface and electrically connected to the redistribution layer.

3. The chip package structure as claimed in claim 1, wherein the encapsulant fills the through cavities and the channels.

4. The chip package structure as claimed in claim 1, wherein the chip comprises an active surface facing the redistribution layer and a plurality of pads disposed on the active surface and mounted on the redistribution layer.

5. The chip package structure as claimed in claim 1, wherein a bottom surface of the reinforcing frame further comprises an adhesion layer.

6. The chip package structure as claimed in claim 5, wherein the adhesion layer comprises a solder paste or a die attach film (DAF).

7. The chip package structure as claimed in claim 1, wherein the material of the reinforcing frame comprises metal.

8. The chip package structure as claimed in claim 1, wherein the reinforcing frame further comprises at least one division wall disposed between any two adjacent through cavities to define the through cavities, and at least one of the channels are disposed on the division wall.

9. A manufacturing method of a chip package structure, comprising:
disposing at least one chip on a carrier;
disposing a reinforcing frame on the carrier, wherein the reinforcing frame comprises at least one through cavity, and the chip is disposed in the through cavity, wherein the number of the at least one chip is plural, the number of the at least one through cavity is plural, the chips are disposed in the through cavities respectively, the reinforcing frame further comprises a plurality of channels disposed on a plurality of side walls of the reinforcing frame, and the channels communicate with the through cavities;
forming an encapsulant to encapsulate the chip, the reinforcing frame and covering the carrier;
removing the carrier to expose bottom surfaces of the encapsulant, the chip and the reinforcing frame; and
forming a redistribution layer on the bottom surfaces of the encapsulant, the chip and the reinforcing frame, wherein a stiffness of the reinforcing frame is greater than a stiffness of the redistribution layer.

10. The manufacturing method of the chip package structure as claimed in claim 9, further comprising:
forming a plurality of solder balls on the redistribution layer and electrically connected to the redistribution layer.

11. The manufacturing method of the chip package structure as claimed in claim 9, wherein the encapsulant fills the through cavities and the channels.

12. The manufacturing method of the chip package structure as claimed in claim 9, wherein the chip is mounted on the carrier by a flip-chip bonding technique.

13. The manufacturing method of the chip package structure as claimed in claim 9, wherein the step of disposing the reinforcing frame on the carrier comprises:
disposing an adhesion layer on the carrier; and
disposing the reinforcing frame on the adhesion layer so the reinforcing frame is attached to the carrier.

14. The manufacturing method of the chip package structure as claimed in claim 13, wherein the adhesion layer comprises a solder paste or a die attach film (DAF).

15. The manufacturing method of the chip package structure as claimed in claim 9, wherein the material of the reinforcing frame comprises metal.

16. The manufacturing method of the chip package structure as claimed in claim 9, wherein the reinforcing frame further comprises at least one division wall disposed between any two adjacent through cavities to define the through cavities, and at least one of the channels are disposed on the division wall.

* * * * *